United States Patent
Agarwal et al.

(10) Patent No.: US 8,824,569 B2
(45) Date of Patent: *Sep. 2, 2014

(54) HIGH BANDWIDTH DECOMPRESSION OF VARIABLE LENGTH ENCODED DATA STREAMS

(75) Inventors: Kanak B. Agarwal, Austin, TX (US); Harm P. Hofstee, Austin, TX (US); Damir A. Jamsek, Austin, TX (US); Andrew K. Martin, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 119 days.

This patent is subject to a terminal disclaimer.

(21) Appl. No.: 13/313,072

(22) Filed: Dec. 7, 2011

(65) Prior Publication Data

US 2013/0148745 A1    Jun. 13, 2013

(51) Int. Cl.
*H04B 1/66*    (2006.01)

(52) U.S. Cl.
USPC ................................. 375/241; 341/67; 341/51

(58) Field of Classification Search
CPC .................................... H03M 7/30; H04B 1/66
USPC ............. 375/241, 240, 240.25; 712/204, 213; 341/67
See application file for complete search history.

(56) References Cited

U.S. PATENT DOCUMENTS

| | | | | |
|---|---|---|---|---|
| 5,051,745 A | * | 9/1991 | Katz | 341/51 |
| 5,440,753 A | * | 8/1995 | Hou et al. | 711/108 |
| 5,461,679 A | * | 10/1995 | Normile et al. | 382/304 |
| 5,506,580 A | | 4/1996 | Whiting et al. | |
| 5,890,006 A | * | 3/1999 | Tran et al. | 712/1 |
| 5,963,154 A | | 10/1999 | Wise et al. | |
| 6,061,775 A | * | 5/2000 | Tran et al. | 712/1 |
| 6,215,424 B1 | | 4/2001 | Cooper | |
| 6,219,457 B1 | * | 4/2001 | Potu | 375/240.23 |
| 6,310,563 B1 | | 10/2001 | Har et al. | |
| 6,693,567 B2 | * | 2/2004 | Cockburn et al. | 341/51 |

(Continued)

FOREIGN PATENT DOCUMENTS

| | | |
|---|---|---|
| EP | 0891089 A1 | 1/1999 |
| EP | 0877320 B1 | 1/2004 |
| WO | WO2009/134932 A2 | 11/2009 |

OTHER PUBLICATIONS

U.S. Appl. No. 13/555,547.

(Continued)

*Primary Examiner* — Daniel Washburn
*Assistant Examiner* — Berhanu Tadese
(74) *Attorney, Agent, or Firm* — Stephen J. Walder, Jr.; John D. Flynn (57) ABSTRACT

Mechanisms are provided for decoding a variable length encoded data stream. A decoder of a data processing system receives an input line of data. The input line of data is a portion of the variable length encoded data stream. The decoder determines an amount of bit spill over of the input line of data onto a next input line of data. The decoder aligns the input line of data to begin at a symbol boundary based on the determined amount of bit spill over. The decoder tokenizes the aligned input line of data to generate a set of tokens. Each token corresponds to an encoded symbol in the aligned next input line of data. The decoder generates an output word of data based on the set of tokens. The output word of data corresponds to a word of data in the original set of data.

13 Claims, 6 Drawing Sheets

(56) References Cited

U.S. PATENT DOCUMENTS

| | | | |
|---|---|---|---|
| 6,732,198 B1* | 5/2004 | Johnson et al. | 710/22 |
| 6,781,529 B1 | 8/2004 | Lin et al. | |
| 6,822,589 B1 | 11/2004 | Dye et al. | |
| 6,865,668 B1 | 3/2005 | Beneset et al. | |
| 6,944,751 B2* | 9/2005 | Fetzer et al. | 712/218 |
| 7,180,433 B1* | 2/2007 | Grotmol | 341/51 |
| 7,233,265 B2 | 6/2007 | Cockburn et al. | |
| 7,305,542 B2* | 12/2007 | Madduri | 712/204 |
| 7,439,883 B1* | 10/2008 | Moni et al. | 341/60 |
| 7,492,290 B1 | 2/2009 | Schneider | |
| 7,500,103 B2 | 3/2009 | Cockburn et al. | |
| 7,640,417 B2* | 12/2009 | Madduri | 712/204 |
| 7,681,013 B1* | 3/2010 | Trivedi et al. | 341/67 |
| 7,817,069 B2 | 10/2010 | Schneider | |
| 7,872,598 B2 | 1/2011 | Baktir et al. | |
| 8,013,762 B2 | 9/2011 | Matthews et al. | |
| 8,244,911 B2* | 8/2012 | Bass et al. | 709/247 |
| 8,325,069 B2 | 12/2012 | Gopal et al. | |
| 2003/0091242 A1* | 5/2003 | Kakarala et al. | 382/239 |
| 2003/0163672 A1* | 8/2003 | Fetzer et al. | 712/218 |
| 2003/0185305 A1* | 10/2003 | MacInnis et al. | 375/240.25 |
| 2003/0236964 A1* | 12/2003 | Madduri | 712/204 |
| 2004/0028141 A1* | 2/2004 | Hsiun et al. | 375/240.25 |
| 2004/0116143 A1* | 6/2004 | Love et al. | 455/522 |
| 2004/0120404 A1* | 6/2004 | Sugahara et al. | 375/240.23 |
| 2004/0221143 A1 | 11/2004 | Wise et al. | |
| 2004/0264696 A1* | 12/2004 | Cockburn et al. | 380/200 |
| 2005/0128109 A1 | 6/2005 | Sane et al. | |
| 2005/0169364 A1* | 8/2005 | Singh | 375/240 |
| 2006/0291560 A1* | 12/2006 | Penna et al. | 375/240.16 |
| 2007/0113222 A1* | 5/2007 | Dignum et al. | 717/143 |
| 2007/0174588 A1 | 7/2007 | Fuin | |
| 2008/0022074 A1* | 1/2008 | Madduri | 712/213 |
| 2008/0198047 A1* | 8/2008 | Niemi et al. | 341/67 |
| 2008/0232461 A1* | 9/2008 | Dachiku | 375/240.01 |
| 2009/0006510 A1 | 1/2009 | Laker et al. | |
| 2009/0220009 A1* | 9/2009 | Tomita et al. | 375/240.25 |
| 2010/0020825 A1* | 1/2010 | Bass et al. | 370/477 |
| 2010/0141488 A1* | 6/2010 | Baktir et al. | 341/67 |
| 2011/0208833 A1 | 8/2011 | Fallon | |
| 2011/0280314 A1 | 11/2011 | Sankaran et al. | |
| 2013/0103695 A1* | 4/2013 | Rarrick et al. | 707/748 |
| 2013/0147644 A1 | 6/2013 | Agarwal | |
| 2013/0148745 A1* | 6/2013 | Agarwal et al. | 375/241 |

OTHER PUBLICATIONS

Deutsch, L. P., "Deflate Compressed Data Format Specification version 1.3", Network Working Group RFC 1951, May 1996, 25 pages.

Lee, J.K. et al., "Token-Ring Reservation Enhancer for Early Token Release", IBM Technical Disclosure Bulletin, vol. 33, No. 7, IPCOM000102647D, Dec. 1, 1990, 6 pages.

Moertl, D.F. et al., "Direct Access Storage Device Compression and Decompression Data Flow", IBM Technical Disclosure Bulletin, vol. 38, No. 11, IPCOM000116855D, Nov. 1, 1995, 7 pages.

International Search Report and Written Opinion dated Feb. 28, 2013 for International Application No. PCT/CN2012/084440, 10 pages.

Office Action dated Jun. 4, 2013 for U.S. Appl. No. 13/555,547; 14 pages.

Agarwal, Kanak B. et al., "Differential Encoder with Look-ahead Synchronization", filed Oct. 2, 2013, U.S. Appl. No. 14/044,212.

Agarwal, Kanak B. et al., "Efficient Context Save/Restore During Hardware Decompression of DEFLATE Encoded Data", filed Aug. 28, 2013, U.S. Appl. No. 14/012,382.

Agarwal, Kanak B. et al., "Hardware Decompression of DEFLATE Encoded Data with Multiple Blocks", filed Aug. 28, 2013, U.S. Appl. No. 14/012,452.

ASPRS Board, "LAS Specification Version 1.2", ASPRS Board Meeting, Sep. 2, 2008, 13 pages.

Blanco, R. et al., "Dynamic Random Access Memory Refresh Method in Triple-Modular-Redundant System", IBM Technical Disclosure Bulletin, Jul. 1, 1993, vol. 36, No. 7, pp. 7-12.

Burger, E. et al., "A Session Initiation Protocol (SIP) Event Package for Key Press Stimulus (KPML)", Internet Society, Standards Track, Request for Comments 4730, Nov. 1, 2006, 58 pages.

Deutsch, P. et al., "ZLIB Compressed Data Format Specification Version 3.3", Internet Society, ip.com, IPCOM000004248D, May 1, 1996, 13 pages.

Pereira, R., "IP Payload Compression Using DEFLATE", Internet Society, ip.com, IPCOM000002967D, Dec. 1, 1998, 6 pages.

Surtees, A. et al., "Signaling Compression (SigComp) User's Guide", Internet Society, ip.com, IPCOM000136745D, May 1, 2006, 45 pages.

* cited by examiner

HIGH BANDWIDTH DECOMPRESSION OF VARIABLE LENGTH ENCODED DATA STREAMS

BACKGROUND

The present application relates generally to an improved data processing apparatus and method and more specifically to mechanisms for providing high bandwidth decompression of variable length encoded data streams.

Lossless data compression is a class of data compression algorithms that allow the exact original data to be reconstructed from the compressed data. The term "lossless" is in contrast to lossy data compression techniques which only allow an approximation of the original data to be reconstructed in exchange for better compression rates. Lossless data compression is used in many different types of applications including the ZIP compression format, GZIP compression in Unix operating system based computing systems, and the like.

One type of lossless data compression is the DEFLATE data compression algorithm described in U.S. Pat. No. 5,051,745. The DEFLATE data compression algorithm makes use of a combination of the Lempel-Ziv LZ77 compression algorithm and Huffman coding. LZ77 compression is a sliding window compression technique in which, for a range (or window) of data, literal bytes of strings that have not yet been detected as duplicated are stored and when a duplicate string is detected within the range (or window), a pointer to the previously stored literal bytes is stored instead. The pointer comprises a length and a backward distance within the range (or window). Huffman encoding is then applied to the literal bytes and pointers in the LZ77 algorithm. Huffman encoding provides the ability to encode literal bytes and pointers using variable length encoding. More information regarding the DEFLATE data compression algorithm may be found in Deutsch, "DEFLATE Compressed Data Format Specification," version 1.3, Network Working Group RFC 1951, May 1996.

SUMMARY

In one illustrative embodiment, a method, in a data processing system, is provided for decoding a variable length encoded data stream. The method comprises receiving, by a decoder of the data processing system, an input line of data, wherein the input line of data is a portion of the variable length encoded data stream. The method further comprises determining, by the decoder, an amount of bit spill-over of the input line of data onto a next input line of data for symbol alignment. In addition, the method comprises aligning, by the decoder, the input line of data to begin at a symbol boundary based on the determined amount of bit spill-over from the previous input line of data. Moreover, the method comprises tokenizing, by the decoder, the aligned input line of data to generate a set of tokens, wherein each token corresponds to a variable length encoded symbol in the aligned next input line. In addition, the method comprises generating, by the decoder, an output word of data based on the set of tokens, wherein the output word of data corresponds to a word of data in the original set of data.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

The illustrative embodiments provide mechanisms for providing high bandwidth decompression of variable length encoded data streams. The mechanisms of the illustrative embodiments compensate for the variable length encoded symbols in a compressed data stream introduced by the compression technique utilized, e.g., variable length Huffman encoding or other variable length encoding techniques. With the mechanisms of the illustrative embodiments compensating for this variable length encoded symbols in the encoded data stream, parallel decompression on a block of data in the data stream can be performed which increases the throughput and speed of the decompression operation. As a result, a high bandwidth, high speed decompression mechanism is provided that is able to operate on variable length encoded data streams.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 1:
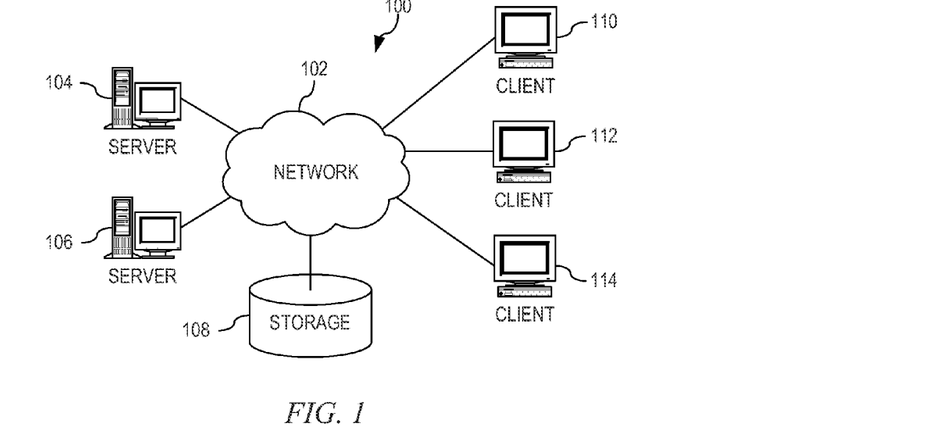
FIG. 1 depicts a pictorial representation of an example distributed data processing system in which aspects of the illustrative embodiments may be implemented.
Figure 2:
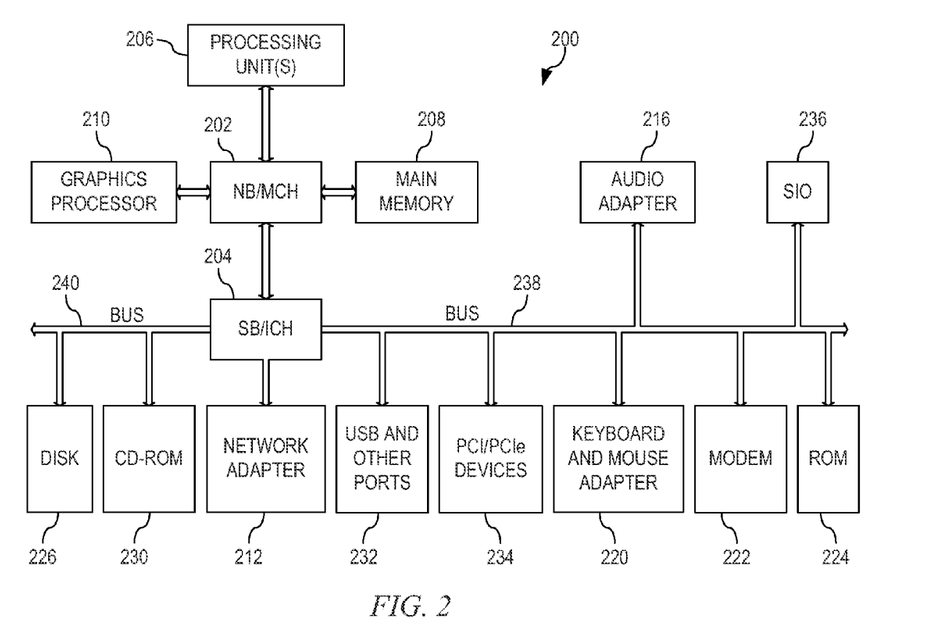
FIG. 2 is a block diagram of an example data processing system in which aspects of the illustrative embodiments may be implemented.

Thus, the illustrative embodiments may be utilized in many different types of data processing environments. In order to provide a context for the description of the specific elements and functionality of the illustrative embodiments, FIGS. 1 and 2 are provided hereafter as example environments in which aspects of the illustrative embodiments may be implemented. It should be appreciated that FIGS. 1 and 2 are only examples and are not intended to assert or imply any limitation with regard to the environments in which aspects or embodiments of the present invention may be implemented. Many modifications to the depicted environments may be made without departing from the spirit and scope of the present invention.

FIG. 1 depicts a pictorial representation of an example distributed data processing system in which aspects of the illustrative embodiments may be implemented. Distributed data processing system 100 may include a network of computers in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

FIG. 2 is a block diagram of an example data processing system in which aspects of the illustrative embodiments may be implemented. Data processing system 200 is an example of a computer, such as client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows 7®. An object-oriented programming system, such as the Java™ programming system, may run in conjunction with the operating system and provides calls to the operating system from Java™ programs or applications executing on data processing system 200.

As a server, data processing system 200 may be, for example, an IBM® eServer™ System p® computer system, running the Advanced Interactive Executive (AIX®) operating system or the LINUX® operating system. Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1 and 2 may vary depending on the implementation. Other internal hardware or peripheral devices, such as flash memory, equivalent non-volatile memory, or optical disk drives and the like, may be used in addition to or in place of the hardware depicted in FIGS. 1 and 2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device that is configured with flash memory to provide non-volatile memory for storing operating system files and/or user-generated data, for example. Essentially, data processing system 200 may be any known or later developed data processing system without architectural limitation.

With reference again to FIGS. 1 and 2, a data processing or computing device/system, such as server 106 in FIG. 1 which may be implemented as the data processing system of FIG. 2 for example, or another type of data processing system having different configuration and composition of elements but capable of implementing the mechanisms of the illustrative embodiments as described hereafter, receives an encoded data stream having variable length portions of compressed data that need to be decoded into the original data of the encoded data stream so that the data processing/computing system is able to process the original data. The encoded data stream may be transmitted by one or more of the other data processing systems/computing devices coupled to the server 106 in this example, e.g., server 104, clients 110, 112, and/or 114, or the like. The encoded data stream may be transmitted via the one or more networks 102. Of course any other scenario in which a variable length encoded data stream may be received by a data processing system/computing device implementing the mechanisms of the illustrative embodiments may likewise be utilized with the mechanisms of the illustrative embodiments. That is, it is not important what manner the variable length encoded data stream is transmitted, or the circumstances under which the variable length encoded data stream is transmitted, to the data processing system/computing device, only that a variable length encoded data stream is received at the data processing system/computing device and is then subsequently operated on by the mechanisms of the illustrative embodiments as will be described hereafter.

The variable length encoded data stream may be encoded using any known or later developed encoding algorithm that generates variable length symbols to encode original non-encoded data. For purposes of the present description, it will be assumed that the variable length encoded data stream was encoded using a DEFLATE algorithm and thus, the variable length encoded data stream has a DEFLATE format. However, it should be appreciated that the present invention is not limited to use with DEFLATE formatted data streams and other data streams having a variable length encoding may be used with the mechanisms of the illustrative embodiments without departing from the spirit and scope of the illustrative embodiments.

Typically, variable length encoded data streams do not lend themselves to parallel decoding operations, i.e. a processor a data processing system is not able to decode portions of the data stream in parallel. This is because there are no byte alignment markers in the data stream and thus, it cannot be determined from the data stream where one portion of data starts and ends and another portion of data starts and ends, e.g., one portion of data may be 7 bits long, another portion may be 9 bits long, yet another may be 16 bits long, etc. and it cannot be determined from the data stream where these boundaries lie. As a result, one cannot simply break the data stream into chunks that are then processed in parallel since the breaking may be done within a symbol, thereby causing an incorrect decompression result to be generated. As a result, the processing of a variable length encoded data stream is generally performed using a sequential decoding operation which limits the throughput and speed by which the decoding of the variable length encoded data stream may be accomplished.

Figure 3:
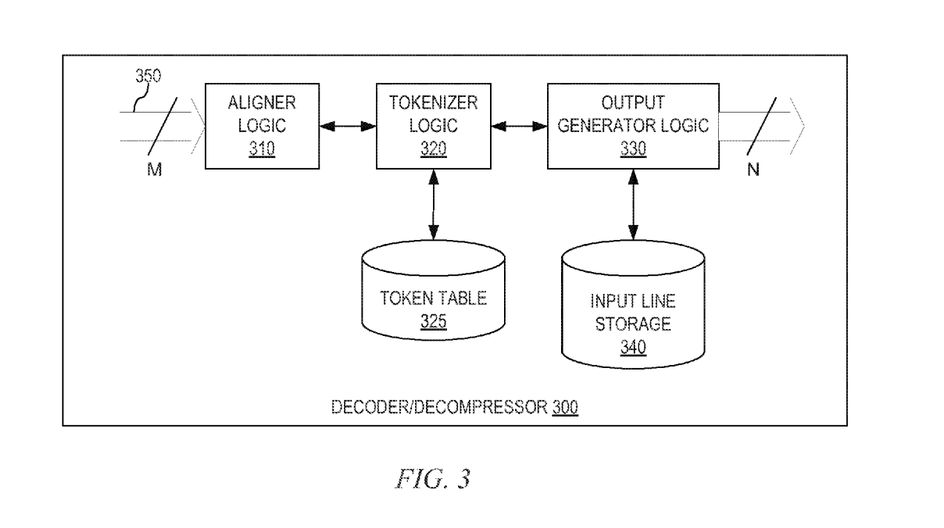
FIG. 3 is an example block diagram of a decoder/decompressor architecture in accordance with one illustrative embodiment.

The illustrative embodiments provide mechanisms for taking into consideration the variable length symbols in an encoded (or compressed) data stream when performing a decoding or decompression operation on the encoded data stream. That is, the illustrative embodiments provide a decoder or decompressor mechanism that operates on variable length encoded data streams in a parallel fashion. FIG. 3 is an example block diagram of one such decoder/decompressor architecture in accordance with one illustrative embodiment. The elements shown in FIG. 3 may be implemented in hardware, software executed by one or more hardware devices, or any combination of hardware and/or software. In one illustrative embodiment, the elements of FIG. 3 are implemented in circuit logic and thus, represent a hardware only illustrative embodiment. In other illustrative embodiments, one or more of the elements shown in FIG. 3 may be implemented as software, firmware, or the like, that is executed by a hardware device, e.g., hardware implemented processor, to perform its functionality. In still other illustrative embodiments, some of the elements in FIG. 3 may be implemented as hardware-only circuitry while other elements are implemented as software, firmware, or the like, executed on one or more hardware devices.

As shown in FIG. 3, the decoder/decompressor 300 comprises alignment logic 310, tokenizer logic 320, token table data structure storage 325, output generator logic 330, and data stream input line storage 340. The decoder/decompressor 300 receives as input a variable length encoded data stream 350. During each processor cycle, the decoder/decompressor 300 receives an "input line" of the variable length encoded data stream 350, which is defined as a number of bytes of data of the input data stream received during a processor cycle. The input line has a fixed size or number of bytes M. For a compression ratio of the variable length encoded data stream 350 that is greater than or equal to 1, the number of bytes M in the input line is less than or equal to a number of bytes N of decompressed output that is sought to be generated every processor cycle. Within the variable length encoded data stream 350, fixed length characters in the original data are encoded as variable length symbols. For example, when Huffman encoding is utilized, such as in the specific case of the variable length data stream 350 being generated using a DEFLATE compression algorithm with static Huffman encoding, each of the encoded symbols may have a variable length between a minimum Huffman code length, $H_{min}$ (e.g., 7 bits), up to a longest Huffman code length, $H_{max}$ (e.g., 31 bits).

The alignment logic 310 of the decoder/decompressor 300 operates to align input data in the input line to start at an encoded symbol boundary, where a symbol in the encoded data stream is represented using a variable number of bits and the symbol corresponds to one or more bytes of the original data prior to encoding/compression. For example, with Huffman encoding, a symbol in compressed data is encoded using a variable length Huffman encoding with the encoded symbol representing either a literal byte of the original data or a pointer to several consecutive bytes of the previously detected original data. Because of variability in the length of the encoded symbols in the fixed size input line, the input lines may not be aligned to begin at a symbol boundary and some encoded symbols may span multiple input lines, e.g., from one input line to a next input line.

As mentioned above, in the context of the present description, an input line refers to encoded data with a fixed number of bytes. An input line is received and processed every processor cycle. The term "symbol" as it is used herein with regard to the encoded data stream refers to a variable length encoding representation in the encoded data stream where each symbol may be decoded/decompressed to create one or more bytes of original data. For example, an input line may be received that contains 8 bytes (64 bits) and which may contain 5 symbols of lengths 17, 8, 9, 21, and 11 bits (total=66). In this example, symbol 1 of 17 bits may decode into 13 bytes of original data, symbol 2 may decode into 1 byte of original data and so on. Moreover, the total number of bits in the symbols 1-5 is 66 bits and thus, there is a bit spill-over of 2 bits. Thus, the next line must be shifted by 2 bits to align it to begin at a new symbol boundary.

Figure 4:
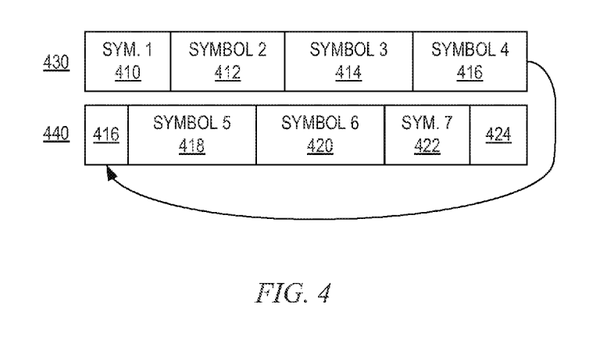
FIG. 4 is an example diagram illustrating a plurality of input lines illustrating a spill-over of bits of a portion of data from one input line to another.

FIG. 4 is an example diagram illustrating a plurality of input lines illustrating a spill-over of bits of an encoded symbol from one input line to another. As shown in FIG. 4, symbols 410-424, which correspond to encoded or compressed symbols in the compressed data. A first input line 430, which again is a number of bytes of compressed data received within a processor cycle, comprises symbols 410-414 and a first part of symbol 416. The symbol 416 spills over into the next input line 440 such that bits of the symbol 416 are present in both the input line 430 and the input line 440. This is referred to as "bit spill over." Thus, the offset in input line 440 that identifies the beginning of symbol 418 depends on the number of bits that spill over from input line 430. The minimum number of bits that spill over is 0 whereas the maximum spill over is $H_{max}-1$ since the size of an encoded symbol is at most the maximum size of the code $H_{max}$ and at least one bit must be present in input line 430 in order for there to be a spill over.

Thus, in order to align the input line 440, one must first determine the amount of spill over from the previous input line 430 and must compensate for this spill over. This is the functionality provided by the aligner logic 310 of the decoder/decompressor 300 in FIG. 3. In order to perform parallel processing of these input lines, the input lines need to be aligned at the start of a symbol boundary by compensating for bit spill over. Once aligned by compensating for such bit spill over, the mechanisms of the illustrative embodiments may operate on the aligned input lines in a parallel fashion.

Since it is not known a priori what the bit spill over is for a particular pair of input lines 430 and 440, the aligner logic 310 of the illustrative embodiments uses a pipeline architecture for speculative decoding with all spill over options followed by a late select operation. The speculative decoding comprises a $H_{max}$ way speculative processing of each line for all possible offsets, from 0 to $H_{max}-1$. That is, every possible offset is considered in parallel when decoding the line and based on the results of the decoding, and a decoding result of a previous line, one of the decoded results for one of the possible offsets is selected. The speculative decoding is performed for each offset in the input line in a parallel, and pipelined manner.

To further explain the manner by which the correct bit spill over is identified and the corresponding offset is determined, consider the following simplified example case. Assume that there are only two possible offsets corresponding to an offset of x bits and an offset of y bits. Now assume that an input line may contain a maximum of n symbols and the computing device can process at most one symbol every processor cycle so that it takes several cycles to process the input line. In cycle 1, input line 1 is received and the first symbol in the input line 1 is processed considering an offset of x bits and an offset of y bits to find the length of the first symbol in the input line for the two offset cases. In the next processor cycle, input line 2 is received and similarly, the first symbol of line 2 is processed considering an offset of x bits and an offset of y bits. In the same processor cycle, the second symbol of the input line 1 is processed for the two speculative scenarios. This process continues and in n cycles, all possible n symbols of input line 1 are processed and the computing device knows the lengths of all possible n symbols in the line. The total length of all symbols minus the length of the input line indicates possible bit spill over values to the next line. For example, if the total lengths of all symbols for the two speculative cases are 69 bits and 71 bits, and the length of the input line is 64 bits, there are two possible speculative values of bit spill (5 bits and 7 bits). A selection mechanism is provided to select which of the speculative bit spill over, or offsets, is the correct bit spill over or offset based on the determined bit spill over or offset from the decoding of a previous input line of data.

With the mechanisms of the illustrative embodiments, rather than only considering two possible offsets or bit spill overs, as in the example above, any number of possible bit spill overs or offsets may be considered in parallel. For example, with one illustrative embodiments, possible bit spill overs or offsets from 0 to Hmax−1 bits are considered when processing each input line.

Figure 5:
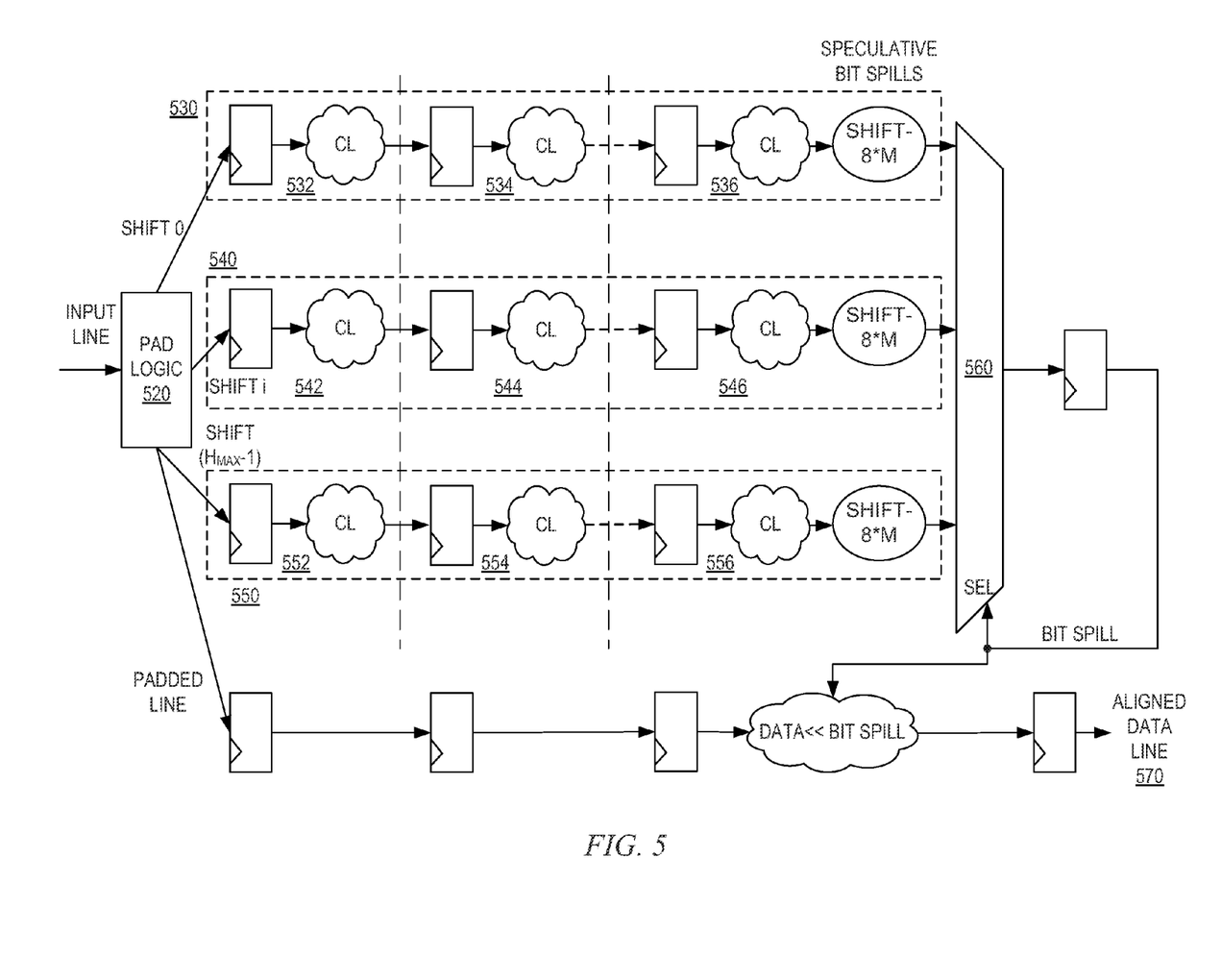
FIG. 5 is an example block diagram illustrating an operation of the alignment logic of the decoder/decompressor when determining the alignment of an input line in accordance with one illustrative embodiment.

FIG. 5 is an example block diagram illustrating an operation of the alignment logic 310 of the decoder/decompressor 300 when determining the alignment of an input line in accordance with one illustrative embodiment. As shown in FIG. 5, the alignment logic 310 receives an input line 510 comprising M bytes of encoded/compressed data. The padding logic 520 of the alignment logic 310 pads the input line 510 with a maximum spill over number of bits from a previous input line. Thus, for example, in a first processor cycle a first input line may be received and stored and in the next processor cycle, a second input line may be received and combined with the first input line that was received during the previous processor cycle up to a maximum spill over number of bits. The padded input line is input to parallel pipelines 530-550. Each of the parallel pipelines 530-550 perform a shift of the padded input line by one of the possible offset (bit spill over) amounts. For example, the first pipeline 530 performs a shift of 0 bits, a second pipeline (not shown) may perform a shift of 1 bit, a third pipeline (not shown) may perform a shift of 2 bits, and so on. Thus, pipeline 540 performs a shift of i bits and a final pipeline 550 performs a shift of ($H_{max}-1$) bits, or a maximum offset (bit spill over).

In each pipeline 530-550, each stage 532-536, 542-546, and 552-556 of the pipeline stores the shifted and padded input line and decodes the next symbol of the shifted and padded input line. The pipelines 530-550 have a pipeline depth of $8*M/H_{min}$, where $H_{min}$ is the minimum encoded symbol length, which in this particular example of static Huffman encoding is 7 bits. The size of the symbol is based on the symbol type and has a width w (or length) which is specified in the encoding algorithm and which is known to the aligner logic 310. For example, using the DEFLATE algorithm and data format, lengths (widths) for particular codes in the symbols in the shifted and padded input line are known by reading an encoding table associated with the encoding algorithm. For example, the encoding table has entries that define that for a particular pattern of bits, what the length of the next encoded symbol will be. For example, the encoding table may define that if the next n bits are 1010111 . . . , then the length of the next symbol is x, and if the next n bits are 111000 . . . , then the length is the next symbol is y, and so on. Once the length of the next symbol is known, the input line may be shifted by that number of bits and the next n bits may be again examined to find the length of the next symbol, and so on.

Each stage 532-536, 542-546, and 552-556 comprises one or more registers and decode/decompression logic, referred to as computation logic (CL), that decodes/decompresses the next symbol of the shifted and padded input line 510 and updates an accumulated shift amount, i.e. the accumulated shift amount for a stage 532-536, 542-546, and 552-556 is equal to the accumulated shift amount from the previous stage plus the width of the next symbol processed by the present stage 532-536, 542-546, and 552-556. This shift amount is accumulated up until an end of the original M byte input line is encountered. That is, the decoding is performed up to the point where the cumulative shift is greater than or equal to the unpadded input line length. This may occur at any of the stages 532-536, 542-546, and 552-556 of the pipelines 530-550 depending upon the shift amount and the widths of the symbols. Once this accumulated shift amount meets or exceeds the size of an input line (in the depicted example the input line being 8*M bits where M is the number of compressed bytes in the input line and 8 represents the number of bits per byte), rather than continuing to accumulate the shift amount, the input line and current accumulated shift amount is passed from stage to stage without updating. For example, if the original input line is 64 bits in length, and it is padded up to 94 bits, the decoding is performed up to a point where the cumulative shift is greater than or equal to 64 bits. In this case, the padding of the input line up to 94 bits is necessary because there may be a symbol that begins at bit 63 and extends until bit 94, for example, and this symbol can only be decoded when all 94 bits are known. The number of bits over the original unpadded input line length of 64 bits is the spill-over or offset for the next input line.

At the end of the pipelines 530-550, the size of the input line (8*M) is subtracted from the accumulated shift amount "shift" to obtain the speculative bit spill over to the next input line. Thus, there is a speculative bit spill over value for each pipeline 530-550 that is input to the multiplexer 560. One of the speculative bit spill over value inputs to the multiplexer 560 is selected as an actual bit spill over to be used to perform a shift operation (e.g., a left shift operation) on the next input line so as to align the next input line to the symbol boundary thereby generating the aligned input line 570.

Referring again to the previous example in which there are two possible bit spill over values x or y, the multiplexer 560 is used to select one of these two values as the spill over for aligning the next input line. The multiplexer 560 knows the offset (or bit spill over) of the very first input line in the compressed data stream and thus, it is possible to select one of the two bit spill over, or offset, values based on the known offset of the very first input line, i.e. input line 1 (there is no spill over from a previous input line for the very first input line but it may contain some known header bits). Once this selection has been made, it is known what the actual bit spill over is from input line 1 to input line 2. In a next processor cycle, this actual bit spill over from input line 1 to input line 2 can be used to select the actual bit spill over from line 2 to line 3. The actual bit spill over from input line 2 to line 3 may then be used to select an actual bit spill over from line 3 to line 4, and so on.

Figure 6:
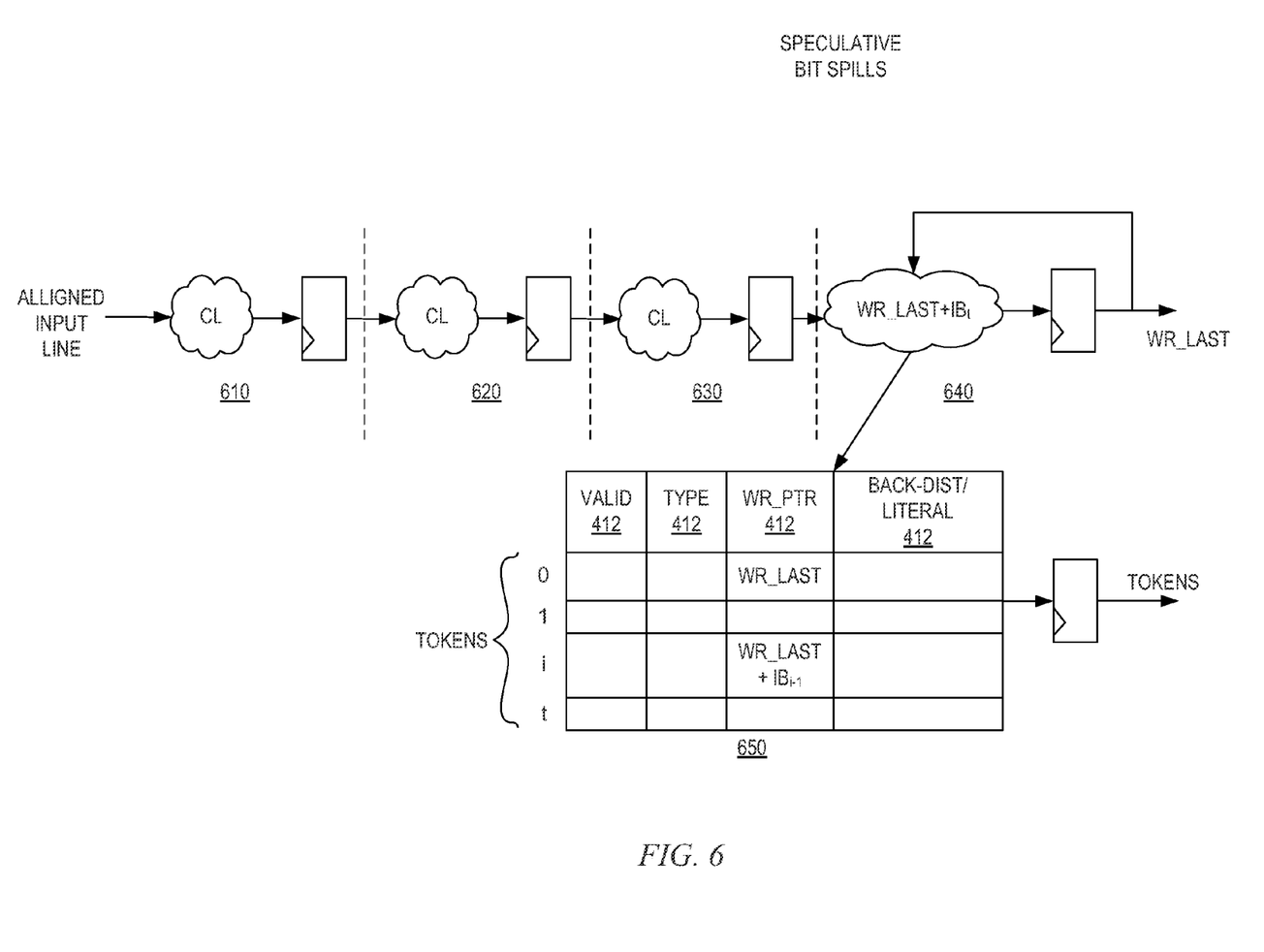
FIG. 6 is an example block diagram of a tokenizer logic pipeline in accordance with one illustrative embodiment.

Returning to FIG. 3, the aligned input line 570 is provided as input to the tokenizer logic 320. While the tokenizer logic 320 is illustrated as being separate from the aligner logic 310, it should be appreciated that the pipeline stages of the tokenizer logic 320 may be integrated with the stages of the pipelines in the aligner logic 310 without departing from the spirit and scope of the illustrative embodiments. The tokenizer logic 320 extracts symbol data from the compressed symbols in the aligned input line in a pipelined manner as shown in FIG. 6. As shown in FIG. 6, the tokenizer logic 320 comprises a plurality of stages 610-640 with each stage comprising computation logic (CL) and one or more registers for storing the results of the computation logic. The pipeline depth is equal to the maximum number of valid tokens per input line (t), which has a ceiling of $8*M/H_{min}$ bits.

The computation logic at each stage 610-640 extracts the symbol data for the next encoded symbol, which corresponds to one or more bytes in the original data, in the aligned input line. The symbol data may include a valid bit, a type bit (e.g., either a literal or a pointer/reference to a previously stored sequence of bytes), a literal value (if the type bit indicates a literal), a backward distance (if the type bit indicates a pointer/reference), and the like. The computation logic further determines a number of inflated bytes (IB) associated with the symbol, i.e. a number of bytes of decoded/uncompressed data generated from the symbol in the aligned input line, and maintains a total number of inflated bytes ($IB_t$) for the input line from stage to stage 610-640 in the pipeline of the tokenizer logic 320.

In a final stage 640 of the tokenizer logic 320 pipeline, a token table 650 is updated with the extracted information from the symbols to thereby generate token entries in the token table 650. As shown in FIG. 6, the token table 650 comprises one or more entries, each entry corresponding to a symbol in the input line. Each entry in the token table 650 stores, for the corresponding token, the extracted valid bit, type (e.g., literal or pointer/reference), a write pointer (wr_ptr), and a backward distance or the actual decoded/decompressed literal symbol depending on the type of the symbol (token). The write pointer (wr_ptr) for a token points to a location in the uncompressed data stream at which the bytes produced by decoding the token should be inserted. The write pointer for a symbol/token i is updated in the final stage 640 based on the last write pointer wr_last, which corresponds to the total inflated bytes produced by all symbols till the end of the previous input line, summed with a cumulative number of inflated bytes up to the previous symbol/token i−1 in the current aligned line, i.e. $wr\_last+IB_{i-1}$. The first token in the aligned input line has a write pointer wr_ptr set to the wr_last value for the previous input line since it is the first symbol/token in the aligned input line. The write last pointer wr_last is also updated in the final stage 640 so that this value is stored for use when processing the next aligned input line. The tokens stored in the token table 650 may be output to the output generator logic 330 in FIG. 3.

The output generator logic 330 takes the tokens generated by the tokenizer logic 320 and generates decoded/decompressed data of N bytes every processor cycle. In one illustrative embodiment, these N bytes comprise a data word that is output by the output generator logic 330 with the data word comprising the decoded/decompressed bytes from the original data that was the source of the encoded input line. The output generator logic 330 comprises a state machine that parses the tokens generated by the tokenizer logic 320, and whose information is stored in entries of the token table 650, and generates the N bytes per processor cycle. The output generator logic 330 maintains a current word position within the decoded/decompressed output stream (out_ctr) and identifies a source token for each of the N bytes of a current output word (src_token [0:N−1]). For example, token X is the source for byte i if $wr\_ptr(token_x) <= (out\_ctr+i) < wr\_ptr(token_{x+1})$, i.e. if the write pointer that points to the beginning of token X is less than or equal to the sum of the current word position and the byte index, and the sum of the current word position and the byte index is less than the write pointer of the next token X+1.

The output generator logic 330 processes tokens from multiple input lines simultaneously, e.g., tokens from at least two input lines simultaneously. If a set of tokens is not fully consumed by the current output word (all tokens in the set are used to produce the current output word of N bytes), i.e. [wr_last(token set 1)>(out_ctr+N)], then the aligner logic 310 and/or tokenizer logic 320 pipelines are stalled. When generating the output word, the output generator logic 330 determines if the output byte is a literal and if so, the literal value is copied to the output byte. If, on the other hand, the output byte is a pointer or reference to a byte in the previously identified sequence of bytes, a memory lookup operation is performed using the backward distance information stored in the token table 650 to retrieve the byte data from memory and copy it to the output word. If there are not enough tokens available to generate the output word, i.e. [wr_last(token set 2)<(out_crt+N), then a partial output word is stored, out_ctr is held, and a new set of tokens is fetched; otherwise out_ctr is incremented by N and the operation repeats.

Figure 7:
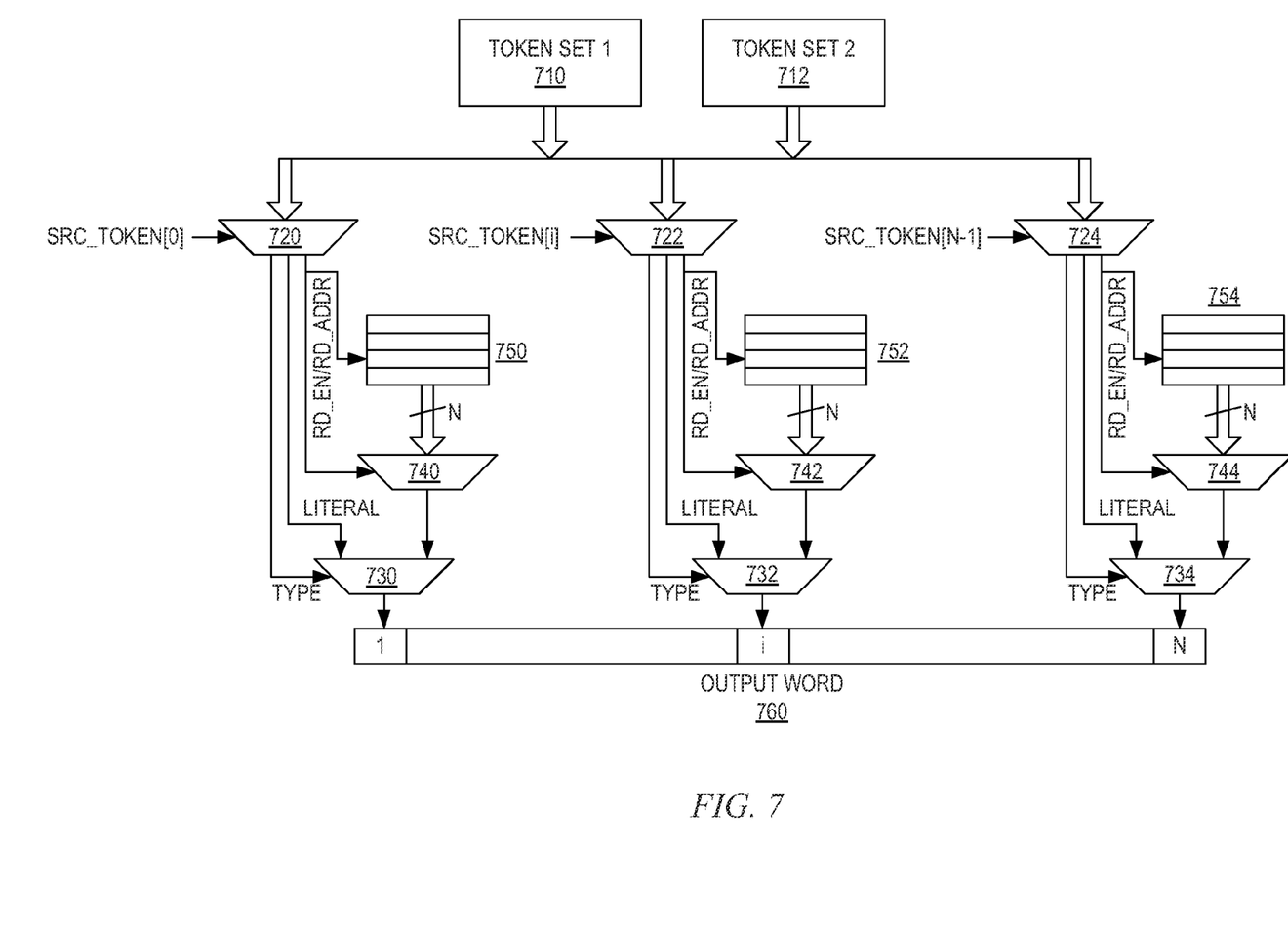
FIG. 7 is an example block diagram of output generator logic in accordance with one illustrative embodiment.

FIG. 7 is an example block diagram of output generator logic in accordance with one illustrative embodiment. As shown in FIG. 7, two token sets 710 and 712, e.g., one from each of two different input lines, are received as inputs into N multiplexers 720-724, where N is the number of bytes per processor cycle of output desired for the particular architecture. The token sets 710-712 are obtained from the token table 650 generated by the tokenizer logic 320 and thus, comprise token entries from the token table 650 along with all of the information stored in these entries.

Each multiplexer 720-724 is associated with a corresponding source token selection signal src_token[i] for that byte, where i ranges from 0 to N−1. Thus, each multiplexer selects a token from the token set corresponding to the source token selection signal src_token[i] that identifies the source token for that particular byte in the output word. The multiplexer 720-724 comprises additional logic for outputting, based on the token entry in the token set corresponding to the selected token, the corresponding token type (literal or pointer/reference) as a selection signal into another multiplexer 730-734, the literal data from the token table entry, in the case where the token type is a literal, as an input to the multiplexer 730-734, and a read enable/read address, determined based on a backward distance field of the token table entry in the case that the token type is a pointer/reference, which is input to another multiplexer 740-744 and also to RAM 750-754.

A separate dedicated memory 750-754, or portion of a shared memory with N read ports, is provided for each of the output bytes that are to be generated per processor cycle. Each of these memories 750-754 store the same decompressed/decoded data, i.e. each of the memories 750-754 are duplicates of each other. Each of the N memories 750-754, corresponding to the N bytes in the output word 760, is organized as an N byte word. Alternatively, a shared memory may be used which is organized as an N byte word and has N read ports where each read port serves one of the N bytes in the output word 760. The memories 750-754 can share a common write port. The total memory capacity is determined by previous history that can be referenced by a pointer/reference token. For example, the history is 32 KB for DEFALTE specifications. If it is assumed that N=16, this 32 KB memory is then organized as 2K memory words of 16 bytes each, Depending on the read enable and read address signal, a memory word of 16 bytes is read. The higher order bits of read address signal are used to read a word from the memory (11 bits in the case of 32 KB memory) and lower order bits (4 in the case of the 16 byte word) are used to select one of the N bytes that are read from the memory (multiplexers 740-744).

The selected byte from the memory 750-754 is fed as an input to multiplexer 730-734 along with the literal output from multiplexer 720-724. Based on the token type, i.e. literal or pointer/reference, one of these inputs is selected as an output byte for the output word 760 at a corresponding location 1 to N in the output word. For example, if the token type is a literal type, then the literal data input to the multiplexer 730-734 is selected. If the token type is a pointer/reference, then the byte output from the multiplexer 740-744 is selected for output by the multiplexer 730-734. Thus, each of the multiplexers 730-734 output a byte of data to be included in the output word 760 at the correct position within the output word. This output word 760 may then be provided to other logic in the computing device for processing, e.g., to a central processor or other functional unit in the computing device which may operate on the output word 760 based on software, firmware, or the like, executing on the computing device. The decoded output word is also stored as an N byte word in each of the N memories at a memory location determined by the current word position within the decoded/decompressed output stream Thus, with the mechanisms of the illustrative embodiments, a high bandwidth parallel processing of variable length encoded data streams is made possible. With these mechanisms, a single data stream may be processed in parallel even when the single data stream comprises symbols of variable length. The mechanisms of the illustrative embodiments compensate for the variable length symbols by determining a bit spill over from one input line to another, realigning the input lines such that they start at a symbol boundary, and then processing the lines and their corresponding symbols/tokens accordingly in a parallel pipelined manner. This greatly increases the throughput and speed by which variable length encoded data streams may be processed by eliminating the requirement for serialized processing of such data streams.

Figure 8:
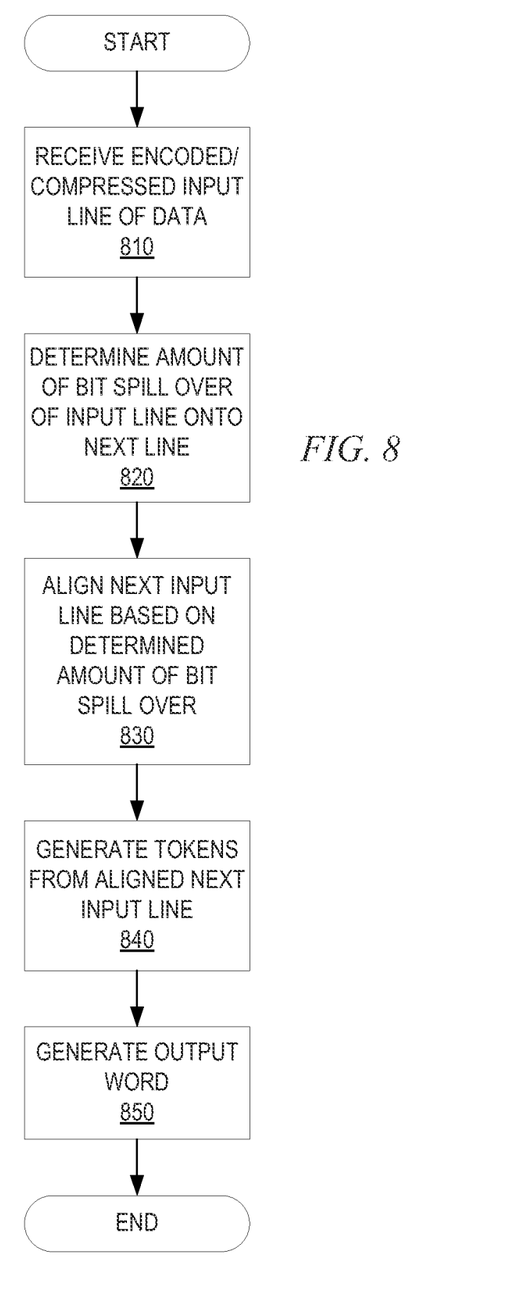
FIG. 8 is a flowchart outlining an example operation for processing a variable length encoded data stream in accordance with one illustrative embodiment.

FIG. 8 is a flowchart outlining an example operation for processing a variable length encoded data stream in accordance with one illustrative embodiment. The operation outlined in FIG. 8 may be implemented in a decoder/decompressor of a data processing system/computing device. This decoder/decompressor may be integrated into the data processing system/computing device as a co-processor, as part of a network or storage adapter, as a separate hardware device, or a combination of one or more of these hardware devices and one or more software mechanisms executed on one or more processor devices, for example.

As shown in FIG. 8, the operation starts with the decoder/decompressor receiving an input line of data that is a portion of a variable length encoded data stream transmitted to the data processing system/computing device in which the decoder/decompressor is implemented (step 810). The decoder/decompressor determiners an amount of bit spill over of the input line of data onto a next input line of data (step 820) for symbol alignment. The decoder/decompressor aligns the input line of data based on the determined amount of bit spill over (step 830). The decoder/decompressor tokenizes the aligned input line of data to generate a set of tokens, wherein each token corresponds to a symbol in the encoded input line of data (step 840). The decoder/decompressor generates an output word of data based on the set of tokens (step 850). The output word of data corresponds to a word of data in the original set of data. The output word is output to other elements of the data processing system/computing device for processing (step 860) and the operation terminates.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer program product comprising a computer readable storage medium having a computer readable program stored therein, wherein the computer readable program, when executed on a data processing system, causes the data processing system to:
   receive an input line of data, wherein the input line of data is a portion of a variable length encoded data stream comprising a number of bytes of data of the variable length encoded data stream received during a single processor cycle;
   determine an amount of bit spill over of the input line of data onto a next input line of data, wherein the amount of bit spill over is an amount of bits of a symbol, partially present in the input line of data, that is present in the next input line of data;
   align the next input line of data to begin at an encoded symbol boundary based on the determined amount of bit spill over;
   tokenize the aligned next input line of data to generate a set of tokens, wherein each token corresponds to a symbol in the aligned next input line of data; and
   generate an output word of data based on the set of tokens, wherein the output word of data corresponds to a word of data in the original set of data.

2. The computer program product of claim 1, wherein the computer readable program causes the data processing system to determine an amount of bit spill over of the input line of data onto a next input line of data by:
   performing a plurality of speculative decoding operations of the input line of data, each speculative decoding operation corresponding to one of a plurality of different possible bit spill over amounts; and
   determining an amount of bit spill over of the input line of data based on results of the plurality of speculative decoding operations of the input line of data for each of a plurality of possible bit spill over amounts.

3. The computer program product of claim 2, wherein an amount of bit spill over is in the range of 0 bits to $H_{max}-1$ bits, where $H_{max}$ is a maximum length of a variable length symbol in the input line of data, and wherein a speculative decoding operation is performed for each possible number of bits of spill over in the range from 0 to $H_{max}-1$.

4. The computer program product of claim 2, wherein the plurality of speculative decoding operations are performed in parallel, and wherein the computer readable program causes the data processing system to determine an amount of bit spill over of the input line of data by selecting a result of one of the plurality of speculative decoding operations based on an amount of bit spill over determined for a previous line of data in the variable length encoded data stream.

5. The computer program product of claim 2, wherein the computer readable program causes the data processing system to determine an amount of bit spill over by determining the amount of bit spill over based on the results of the plurality of speculative decoding operations and a decoding result of a previous line of data.

6. The computer program product of claim 1, wherein the computer readable program causes the data processing system to tokenize the aligned next input line of data to generate a set of tokens by processing the aligned next input line through a tokenizer pipeline having a plurality of stages, wherein each stage comprises computation logic that extracts symbol data for a next encoded symbol in the aligned next input line, determines a number of inflated bytes associated with the extracted symbol data, and accumulates a total number of inflated bytes for the aligned next input line based on a previous total of inflated bytes for the aligned next input line and a size of the extracted symbol data.

7. The computer program product of claim 6, wherein a final stage of the tokenizer pipeline updates a token table data structure with entries for extracted symbol data extracted from the aligned next input line.

8. The computer program product of claim 7, wherein the computer readable program causes the data processing system to generate an output word of data based on the set of tokens by processing tokens from at least two input lines at substantially a same time.

9. The computer program product of claim 7, wherein the computer readable program causes the data processing system to extract symbol data for a next encoded symbol by extracting data indicating a type of a corresponding extracted symbol as being either a literal symbol type or a reference to a literal symbol type, data indicating a literal value in response to the type indicating a literal symbol type, and data indicating a backward distance pointer in response to the type indicating a reference type, and wherein the computer readable program causes the data processing system to update a token table data structure with entries by populating the entries with extracted symbol data corresponding to an extracted symbol associated with the token table entry.

10. The computer program product of claim 1, wherein the variable length encoded data stream comprises original data encoded using a Huffman encoding algorithm.

11. The computer program product of claim 1, wherein the computer program product causes the data processing system to operate on a line of data from the variable length encoded data stream in pipelined manner to process an input line of data from the variable length encoded data stream every clock cycle.

12. The computer program product of claim 1, wherein the computer readable program further causes the data processing system to generate an output word of data based on the set of tokens by at least one of:
   storing a same portion of decoded data from the variable length encoded data stream in each of a plurality of N memories of output generator logic, where N is a number of bytes of decoded data to be output in the output word each processor cycle; and
   outputting, for each of the N bytes in the output word of data, either a byte of data read from a corresponding memory in the plurality of N memories or a literal value from a token table entry depending upon the symbol type; or storing in a single shared memory of the output generator logic, the single shared memory having N read ports, one for each byte of decoded data to be output in the output word of data per processor cycle, a portion of decode data; and outputting, for each of the N bytes in the output word of data, either a byte of data read from a corresponding read port in the plurality of N read ports or a literal value from a token table entry depending upon the symbol type.

13. An apparatus, comprising:

a processor; and an interface coupled to the processor, wherein a variable length encoded data stream is received via the interface, and wherein the processor comprises logic to:

receive an input line of data, wherein the input line of data is a portion of the variable length encoded data stream comprising a number of bytes of data of the variable length encoded data stream received during a single processor cycle;

determine an amount of bit spill over of the input line of data onto a next input line of data, wherein the amount of bit spill over is an amount of bits of a symbol, partially present in the input line of data, that is present in the next input line of data;

align the next input line of data to begin at an encoded symbol boundary based on the determined amount of bit spill over;

tokenize the aligned next input line of data to generate a set of tokens, wherein each token corresponds to a symbol in the aligned next input line of data; and generate an output word of data based on the set of tokens, wherein the output word of data corresponds to a word of data in the original set of data.

* * * * *